United States Patent
van Veldhoven et al.

(10) Patent No.: US 12,451,903 B2
(45) Date of Patent: Oct. 21, 2025

(54) ADC ERROR COMPENSATION USING POWERS OF ADC OUTPUT

(71) Applicant: NXP B.V., Eindhoven (NL)

(72) Inventors: Robert van Veldhoven, Valkenswaard (NL); Maarten Jelmar Molendijk, Eindhoven (NL)

(73) Assignee: NXP B.V., Eindhoven (NL)

( * ) Notice: Subject to any disclaimer, the term of this patent is extended or adjusted under 35 U.S.C. 154(b) by 213 days.

(21) Appl. No.: 18/215,003

(22) Filed: Jun. 27, 2023

(65) Prior Publication Data

US 2025/0007532 A1 Jan. 2, 2025

(51) Int. Cl.
*H03M 1/00* (2006.01)
*H03M 3/00* (2006.01)

(52) U.S. Cl.
CPC ........... *H03M 3/322* (2013.01); *H03M 3/458* (2013.01)

(58) Field of Classification Search
CPC ....... H03M 3/322; H03M 3/458; H03M 3/476
USPC .......................... 341/118, 120, 143, 144, 155
See application file for complete search history.

(56) References Cited

U.S. PATENT DOCUMENTS

| | | | |
|---|---|---|---|
| 6,535,153 B1 | 3/2003 | Zierhofer | |
| 8,144,043 B2 | 3/2012 | Risbo et al. | |
| 8,670,512 B1 | 3/2014 | Wang | |
| 9,077,571 B2 | 7/2015 | Van De Beek et al. | |
| 11,101,810 B1 | 8/2021 | Veldhoven | |
| 12,170,874 B2 * | 12/2024 | Straeussnigg | ....... H03M 1/1023 |
| 2004/0113824 A1 | 6/2004 | Zierhofer | |
| 2006/0214829 A1 | 9/2006 | Takeuchi et al. | |
| 2012/0306673 A1 | 12/2012 | Ueno | |
| 2013/0064271 A1 | 3/2013 | Van De Beek et al. | |
| 2019/0334545 A1 | 10/2019 | Quiquempoix et al. | |
| 2022/0019883 A1 | 1/2022 | Veldhoven | |

OTHER PUBLICATIONS

Dolhansky, B., "Artificial Neural Networks: Linear Regression (Part 1)", Retrieved from the Internet: URL:https://www.briandolhansky.com/blog/artificial-neural-networks-linear-regression-part-1 [retrieved on Nov. 14, 2024] * Section "Training a neural network to perform linear regression"*, Jul. 2013.

O'Donoghue, K., "A Digitally Corrected 5-m W 2-MS/s SC ΔΣ ADC in 0.25-μm CMOS With 94-dB SFDR", IEEE Journal of Solid-State Circuits, vol. 46, No. 11, Nov. 2011.

(Continued)

*Primary Examiner* — Peguy Jean Pierre

(57) ABSTRACT

A device may include an input terminal configured to receive an analog input signal. A device may include an output terminal configured to output a digital signal x, wherein the digital signal x includes a digital approximation of the analog input signal. A device may include an error correction system connected to the ADC, the error correction system including a first input terminal configured to receive an Nth powered version of the digital signal x, wherein N is a whole number equal to or greater than two, wherein the error correction system is configured to: use the Nth powered version of the digital signal x to determine a correction value; and modify the digital signal x to generate a corrected digital signal by applying the correction value to compensate for analog-to-digital conversion errors occurring within the ADC.

20 Claims, 8 Drawing Sheets

(56) References Cited

OTHER PUBLICATIONS

Zhai et al., High-Speed and Time-Interleaved ADCs Using Additive-Neural-Network-Based Calibration for Nonlinear Amplitude and Phase Distortion, IEEE Transactions on Circuits and Systems I (TCAS-I), 2022, China.
U.S. Appl. No. 17/648,584, filed Jan. 21, 2022.
U.S. Appl. No. 18/201,085, filed May 23, 2023.
U.S. Appl. No. 18/218,366, filed Jul. 5, 2023, entitled "Inter-Symbol Interference Compensation for Analog-to-Digital Converter".
Baccigalupi, A., "Error compensation of A/D converters using neural networks", IEEE Transactions on Instrumentation and Measurement ( vol. 45, Issue: 2, Apr. 1996).
Bernieri, A., "ADC neural modeling", IEEE Transactions on Instrumentation and Measurement ( vol. 45, Issue: 2, Apr. 1996).
Bernieri, A., "ADC neural modeling", Proceedings of 1995 IEEE Instrumentation and Measurement Technology Conference—IMTC '95, Apr. 23-26, 1995.
Chen, S., "An 8-bit 1.25GS/s CMOS IF-Sampling ADC with Background Calibration for Dynamic Distortion", IEEE, 978-1-5090-3700-1, pp. 69-72 (Year: 2016), Nov. 7-9, 2016.
Non-final office action dated Feb. 25, 2025 in U.S. Appl. No. 18/218,366.
Notice of Allowance dated Jun. 13, 2025 in U.S. Appl. No. 18/218,366.

\* cited by examiner

ADC ERROR COMPENSATION USING POWERS OF ADC OUTPUT

TECHNICAL FIELD

Errors in analog to digital converters (ADCs) are compensated for by use of an error correction system, which may implement a machine learning engine. The error correction system is configured to compensate for those errors by analysis of powers of an ADC output.

BACKGROUND

In electronics, an analog-to-digital converter ("ADC") is a system that converts an analog signal, such as a sound picked up by a microphone or light entering a digital camera, into a digital signal. An ADC may also provide an isolated measurement when implemented as an electronic device that converts an input analog voltage or current to a digital number representing the magnitude of the voltage or current.

More specifically, an ADC converts a continuous-time and continuous-amplitude analog signal to a discrete-time and discrete-amplitude digital signal. The conversion involves quantization of the input, so the process necessarily introduces a small amount of error or noise. Furthermore, instead of continuously performing the conversion, an ADC does the conversion periodically, sampling the input signal at a sampling rate, thus limiting the allowable bandwidth of the input signal.

ADCs can suffer from signal degradation due to circuit non-linearities, which can manifest as errors in the output of the ADC. Such non-linearities can introduce harmonic distortion (i.e., noise spurs at multiples of the input signal frequency) and intermodulation products, degrading the quality of the signal.

The circuit non-linearities can be detrimental in a sigma-delta ($\Sigma\Delta$) modulator because in a $\Sigma\Delta$ modulator, noise is shaped such that most of the quantization noise is shifted to the upper frequencies inside the modulator's spectrum. Those non-linearities can fold that carefully shaped noise back into the ADC's baseband due to intermodulation of the high frequency quantization noise partially undoing the effect of noise shaping.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter of the application and uses of such embodiments. As used herein, the words "exemplary" and "example" mean "serving as an example, instance, or illustration." Any implementation or embodiment described herein as exemplary, or an example is not necessarily to be construed as preferred or advantageous over other implementations. Furthermore, there is no intention to be bound by any expressed or implied theory presented in the preceding technical field, background, or the following detailed description.

Analog-to-digital converters (ADCs) can suffer, like any circuit, from signal degradation due to circuit non-linearities. Non-linearities can introduce harmonic distortion and intermodulation (IM) products into the output signal of the ADC. The degrading effect of this non-linearity can be evident in ADCs configured as sigma-delta (ΣΔ) modulators in the form of an increased noise-floor inside the bandwidth of interest. In a sigma-delta modulator, the output noise is shaped such that most of the quantization noise is moved to the upper frequencies of the modulator's spectrum. Such non-linearities fold the shaped noise back to the baseband due to intermodulation of the high frequency quantization noise, which can undo the benefits of noise shaping in those types of ADCs, negatively affecting the modulators performance.

Figure 1:
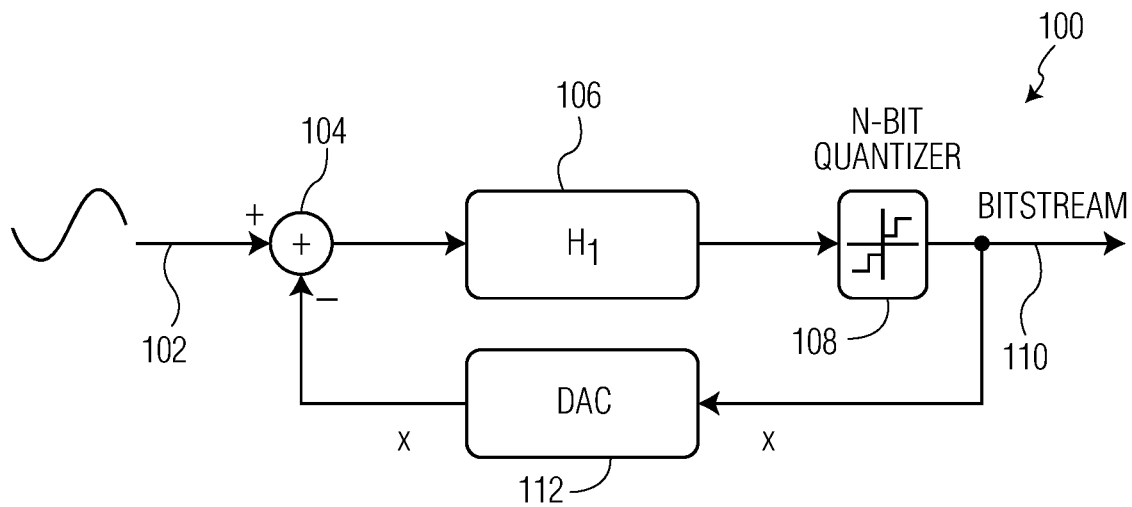
FIG. 1 is a block diagram depicting components of a sigma-delta modulator analog-to-digital converter (ADC).

Sigma-delta modulators are ADCs configured to generate a digital output bitstream where the average magnitude of the digital output bitstream is equal to or equivalent to the magnitude of the sigma-delta modulator's analog input signal. To illustrate, FIG. 1 is a block diagram depicting components of a sigma-delta modulator 100. Sigma-delta modulator 100 includes an input terminal 102 configured to receive an analog input signal. The input signal is passed through summing node 104 to loop filter 106 with a transfer function H1 in which the transfer function H1 may be a discrete- or continuous-time analog filter. The output of loop filter 106 is supplied to quantizer 108, which is configured to convert the output of the integration stages to an amplitude- and time-discrete (i.e., digital) value which is output as a digital bitstream at output terminal 110.

The digital bitstream output at output terminal 110 by sigma-delta modulator 100 is also passed back through digital-to-analog converter 112, which is configured to convert the output digital bitstream back into a corresponding analog signal. Ideally, the analog signal generated by digital to analog converter 112 is an exact match to the input signal originally received at input terminal 102.

The analog output of digital-to-analog converter 112 is supplied to a negative input to summing node 104. In this configuration digital-to-analog converter 112 provides a feedback loop that enables the analog signal output by digital-to-analog converter 112 to be subtracted from the analog input signal received at input terminal 102. The result of that subtraction is supplied to loop filter 106. In this manner, sigma-delta modulator 100 is configured to generate a digital output bitstream having an average power level that matches the power level of the modulator's analog input signal.

Figure 2:
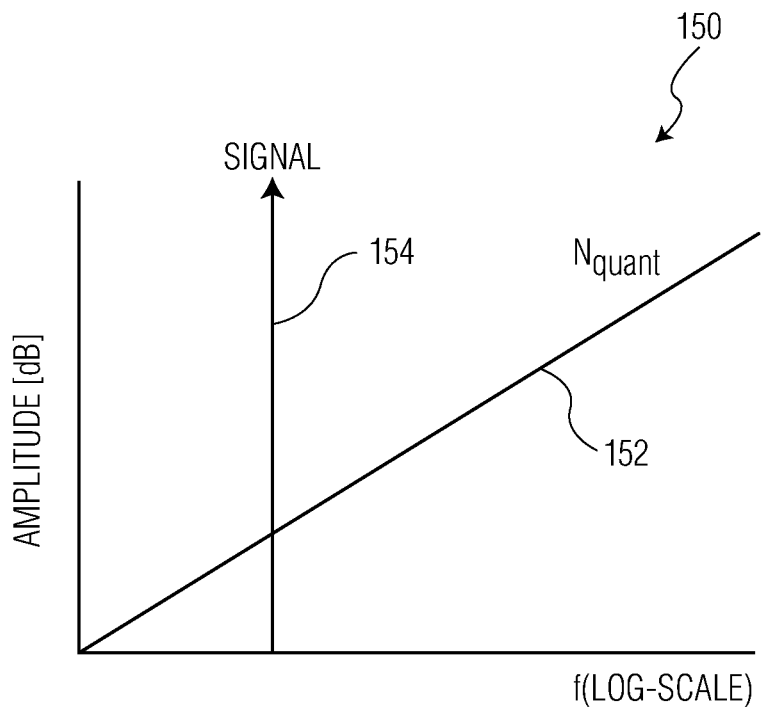
FIG. 2 is a chart depicting an FFT of the output bitstream generated by an ideal sigma-delta modulator when the input to the sigma-delta modulator is a sinusoidal wave.

FIG. 2 is a chart depicting an FFT of the output bitstream generated by the ideal sigma-delta modulator 100 when the input to the sigma-delta modulator is a sinusoidal wave. In chart 150 the horizontal axis represents frequency (on a log scale) while the vertical axis represents amplitude in decibels (dB). As illustrated in chart 150, the sigma-delta modulator implementation shifts the majority of noise (illustrated by line 152) to frequencies that are significantly higher than the frequency at which the signal generated by sigma-delta modulator 100 (indicated by arrow 154) is found (i.e., the frequency at which useful information is contained). This characteristic of sigma-delta modulators (i.e., pushing quantization noise into higher frequencies of the output signal of the modulator) can be useful as the characteristic enables a low-pass filter to be applied to the output of the sigma-delta modulator (e.g., a low-pass filter having a cut-off frequency just above the frequency of the signal in the modulators output) to remove a significant majority of the quantization noise out of the modulators output signal while maintaining the useful portion of the modulator's output signal.

Figure 3:
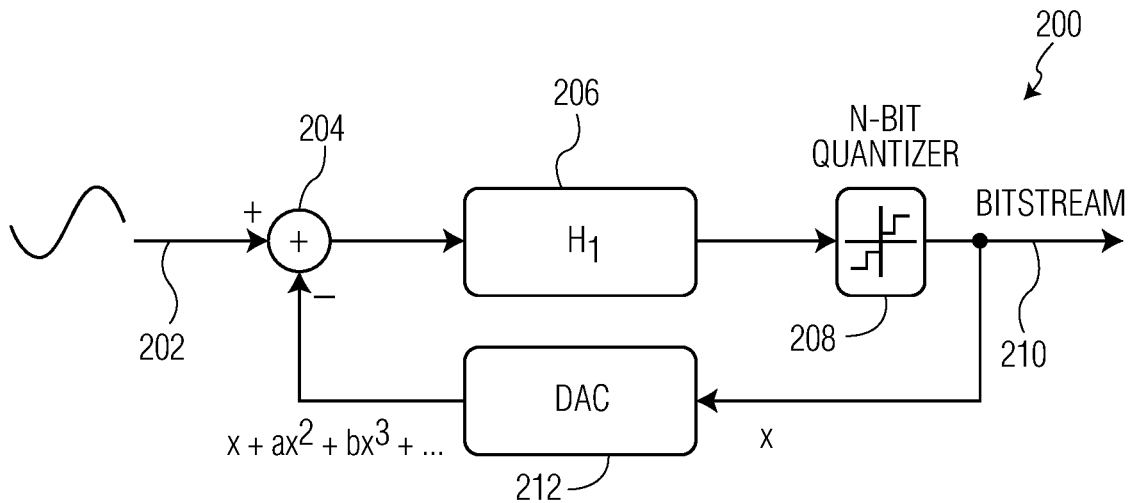
FIG. 3 depicts a non-ideal sigma delta modulator ADC, where the non-ideality is located in the feedback digital-to-analog converter (DAC).

In a non-ideal sigma-delta modulator, however, non-linearities in the components of the modulator result in noise and harmonic distortion being introduced into the output of sigma-delta modulator 100. For example, FIG. 3 depicts a non-ideal sigma delta modulator 200. Like sigma-delta modulator 100, non-ideal sigma delta modulator 200 includes an input terminal 202, summing node 204, loop filter 206, quantizer 208 and output terminal 210. Sigma delta modulator 200 includes a feedback loop that includes digital-to-analog converter 212. However, in the non-ideal sigma delta modulator 200, digital-to-analog converter 212 exhibits some non-linearities such that the output of digital to analog converter 212 includes distortions. Specifically, as illustrated in FIG. 3 the output signal of digital to analog converter 212 includes polynomial non-linear components of the form $ax^2+bx^3+ \ldots$ . These additional distortion components can fold high-frequency spectral components back towards the baseband due to intermodulation, reducing the noise shaping benefits of the sigma-delta modulator implementation and increasing noise levels at frequencies around the frequency of the signal output by the modulator.

Figure 4:
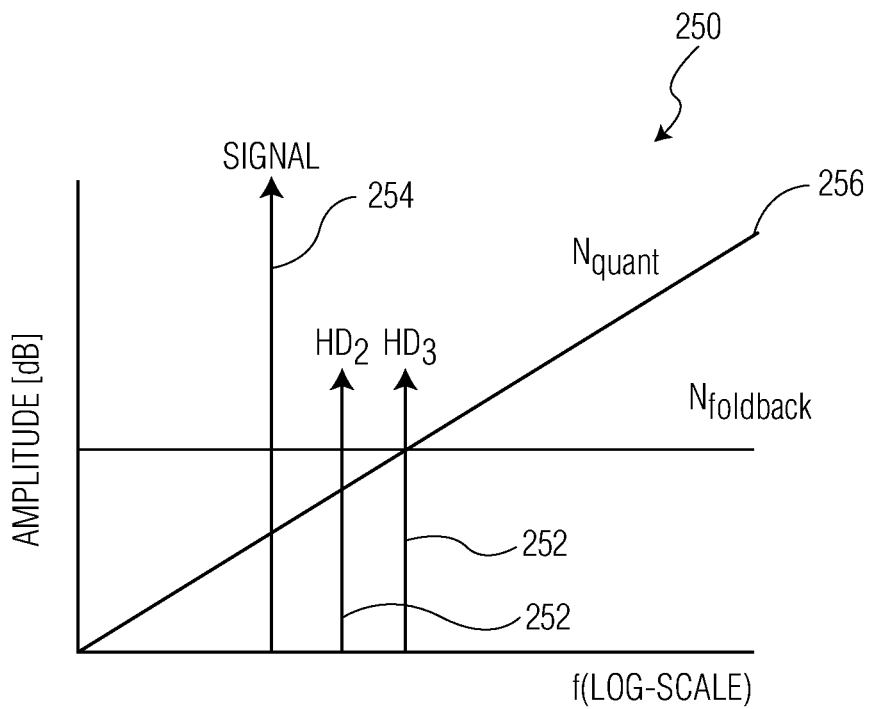
FIG. 4 is a chart depicting an FFT of the output bitstream generated by a non-ideal sigma-delta modulator when the input to the sigma-delta modulator is a sinusoidal wave.

To illustrate, FIG. 4 is a chart depicting an FFT of the output bitstream generated by the non-ideal sigma-delta modulator 200 when the input to the sigma-delta modulator is a sinusoidal wave. In chart 250 the horizontal axis represents frequency (on a log scale) while the vertical axis represents amplitude in decibels (dB). As illustrated in chart 250, the quantization noise generated by the non-ideal digital-to-analog converter 212 results in the generation of IM products 252 at frequencies close to the frequency of the true signal 254 being output by the modulator. This, in turn, reduces the signal-to-noise ratio (SNR) of the modulator, reducing its accuracy and effectiveness. This is reflected in the elevated levels of foldback noise ($N_{foldback}$) illustrated by line 256 in chart 250.

To avoid these problems, care should be taken while designing the circuit components (e.g., amplifiers and/or the feedback digital-to-analog converter) inside the feedback loop of the ΣΔ modulator to minimize circuit non-linearities. Of course, this can be difficult and often comes at the cost of additional silicon area (i.e., large circuit designs) and power requirements.

To mitigate these deficiencies, post-processing can be performed on the output signal of a non-ideal sigma-delta converter to remove unwanted spectral components from the output signal. Although intermodulation products that lower the modulator's SNR are dubbed 'noise' they are still correlated to the quantization noise and loop non-linearities. Therefore, post-processing can reduce the effects of the intermodulation products to improve the SNR of the modulator.

The present disclosure provides a system and method for compensating ADC non-linearities by providing scaled versions of powers of the ADC (e.g., a sigma-delta modulator or Nyquist ADC) output signal to an appropriately configured error correction system. The error correction system may be implemented as a numerical optimizer or neural network where the applied error correction scheme can be learned by the error correction system. By training the error correction system on the powers of the scaled bitstream, the process of removing distortion and folded noise components due to component non-linearities can be simplified. Although the present system and method for error correction may be utilized in conjunction with any type of ADC or modulator, performance improvements may be observed when utilized in conjunction with particular types of ADCs, including oversampled ADCs in which non-linearities may create IM products (from low as well as high-frequency noise components) that fall back into the band of interest (the band of interest is fs/2*1/OSR where OSR is the oversampling ratio), and other types of noise-shaping ADCs in which noise is 'shaped' to be outside of the band of interest. In noise-shaping ADCs, IM products of the noise components can fold back into the band of interest with significant signal degradation because in the ideal noise-shaping ADC most noise was located outside of the band of interest. Sigma-delta modulators are ADCs that use both oversampling and noise-shaping and therefore may observe significant performance improvements when utilized in conjunction with the present system and method.

When the error correction system is implemented using machine learning, any suitable structure and/or implementation techniques may be utilized (e.g., artificial neural network, deep neural network, convolutional neural network, recurrent neural network, autoencoders, reinforcement learning, etc.), fuzzy logic, artificial intelligence ("AI"), deep learning algorithms, deep structured learning hierarchical learning algorithms, support vector machine ("SVM") (e.g., linear SVM, nonlinear SVM, SVM regression, etc.), decision tree learning (e.g., classification and regression tree ("CART"), ensemble methods (e.g., ensemble learning, Random Forests, Bagging and Pasting, Patches and Subspaces, Boosting, Stacking, etc.), dimensionality reduction (e.g., Projection, Manifold Learning, Principal Components Analysis, etc.) and/or deep machine learning algorithms. Non-limiting examples of publicly available machine learning algorithms, software, and libraries that could be utilized within embodiments of the present disclosure include Python, OpenCV, Inception, Theano, Torch, PyTorch, Pylearn2, Numpy, Blocks, TensorFlow, MXNet, Caffe, Lasagne, Keras, Chainer, Matlab Deep Learning, CNTK, MatConvNet (a MATLAB toolbox implementing convolutional neural networks for computer vision applications), DeepLearnToolbox (a Matlab toolbox for Deep Learning (from Rasmus Berg Palm)), BigDL, Cuda-Convnet (a fast C++/CUDA implementation of convolutional (or more generally, feed-forward) neural networks), Deep Belief Networks, RNNLM, RNNLIB-RNNLIB, matrbm, deeplearning4j, Eblearn.lsh, deepmat, MShadow, Matplotlib, SciPy, CXXNET, Nengo-Nengo, Eblearn, cudamat, Gnumpy, 3-way factored RBM and mcRBM, mPoT, ConvNet, Elektronn, OpenNN, NeuralDesigner, Theano Generalized Hebbian Learning, Apache Singa, Lightnet, and SimpleDNN.

The various embodiments disclosed herein are described with respect to utilization of an artificial neural network (also simply referred to herein as a "neural network"). However, a person of ordinary skill in the art is capable of implementing any appropriate machine learning system or other logical network for error correction in a sigma-delta modulator or Nyquist ADC in accordance with embodiments of the present disclosure.

A neural network is typically based on a collection of connected units or nodes referred to as artificial neurons, which loosely model the neurons in a biological brain. Each connection, like the synapses in a biological brain, can transmit a signal to other neurons. An artificial neuron that receives a signal then processes it and can signal neurons connected to it. In neural network implementations, the "signal" at a connection is a real number, and the output of each neuron is computed by some non-linear function of the sum of its inputs (e.g., sigmoid activation). The connections are referred to as edges. Neurons and edges typically have a weight that adjusts as training of the neural network proceeds. The weight increases or decreases the strength of the signal at a connection. Neurons may have a threshold such that a signal is sent only if the aggregate signal crosses that threshold. Typically, neurons are aggregated into layers. Different layers may perform different transformations on their inputs. Signals travel from the first layer (the input layer) to the last layer (the output layer), possibly after traversing the layers multiple times. A neural network architecture may be configured as a feed-forward network with one or more hidden layers, and with a backpropagation learning algorithm. Implementation of a neural network may involve three phases: a training, or learning, phase; a validation phase; and an inference, or production, phase. In the training phase, the neural network essentially learns by comparing its actual output with known correct outputs (or at least outputs that are more near a desired output) to find errors. It then modifies the model accordingly. In the validation phase, the trained neural network is verified by means of data ("validation set"), which may be different from the data used in the training phase. In the inference, or production, phase, the trained and validated neural network is now configured and capable of providing outputs that correspond to any input.

A result of the foregoing is an ADC device that utilizes an error correction system (e.g., a neural network) that has been trained to "know" the form of the analog-to-digital conversion errors of the ADC (e.g., the polynomial non-linearity of the form $ax^2+bx^3+\ldots$), and also to "know" how to compensate for those non-linearities by applying specific error correction.

When the error correction system is implemented as a neural network, the neural network may be implemented with any type of hardware and/or software (as will be further disclosed herein), such as within an appropriate set of digital circuitry suitable for implementation of a neural network or other type of machine learning system. The illustration of the neural networks within the figures is not to be limiting upon the scope of embodiments of the present disclosure. Within the various figures, "(A)" represents that the signal is an analog signal, and "(D)" represents that the signal is a digital signal.

Figure 5:
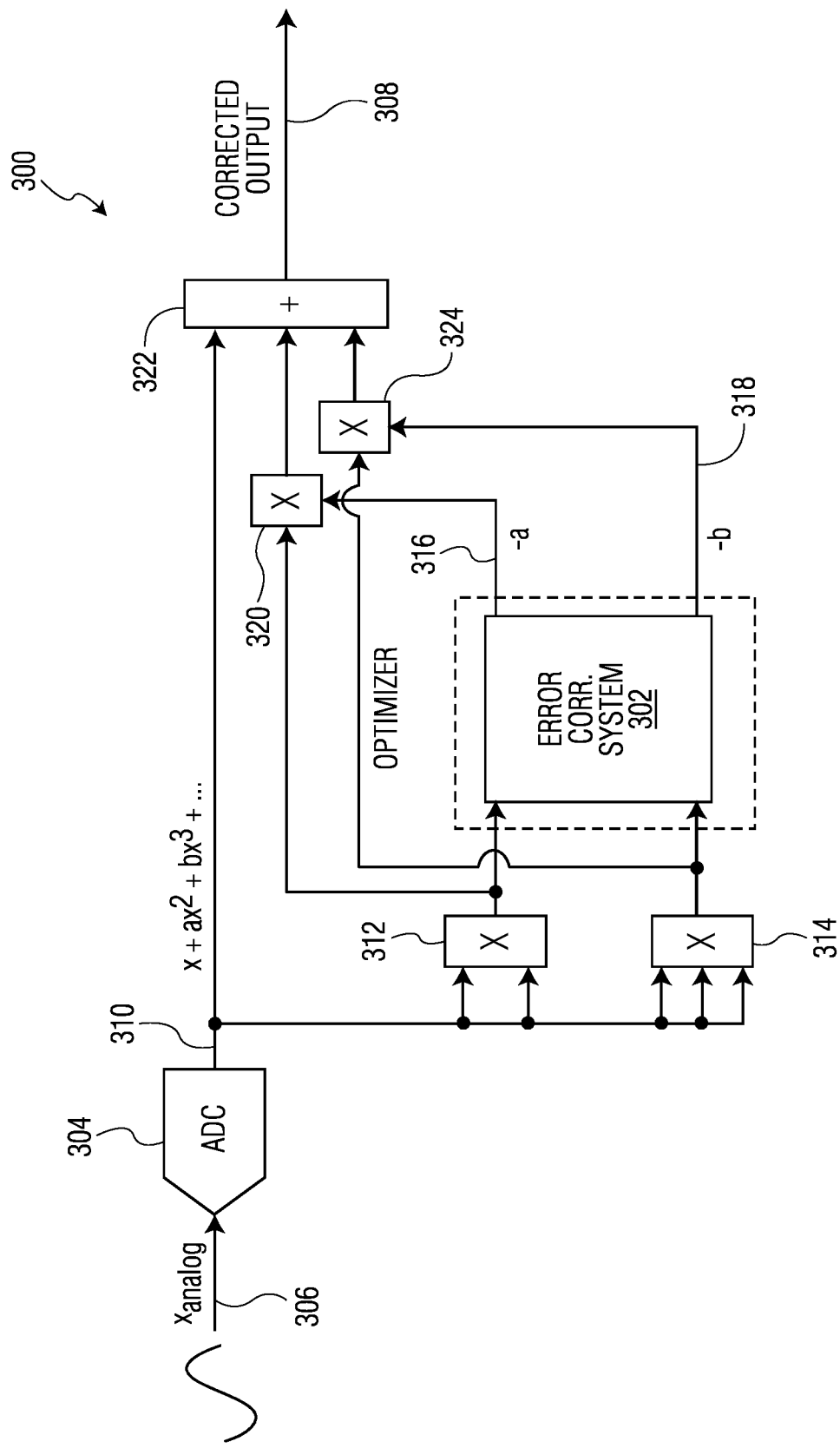
FIG. 5 depicts an ADC system that includes an error correction system configured to correct or minimize errors generated by the ADC, wherein the errors are in the form of polynomial errors.

FIG. 5 depicts an ADC system 300 that includes an error correction system 302 configured to correct or minimize errors generated by ADC 304 in the form of polynomial errors. System 300 includes input terminal 306 configured to receive an analog input signal. System 300 is configured to convert that analog input signal into an output digital stream (e.g., that may comprise a stream of digital bit values or digital word or multi-bit values) at output terminal 308. The magnitudes of the values in the output digital data stream are equivalent to the corresponding magnitude of the analog input signal.

Within system 300, ADC 304 is configured to periodically (e.g., at a sampling rate having frequency $f_s$) measure or sample a magnitude of the analog input signal and convert that analog value into a corresponding digital value that is output at output terminal 310 of ADC 304. If ADC 304 were an ideal ADC device, the magnitude of the output digital value 'x' would equal the sampled magnitude of the analog input signal $x_a$ or $x_{anaog}$. Instead, however, as described above, ADC 304 may generate errors so that the magnitude of the digital output value does not precisely equal the sampled magnitude of the analog input signal. Specifically, ADC 304 introduces polynomial non-linearities or distortion into the output digital value at output terminal so that the output value, instead of being equal to x, is instead equal to $x+ax^2+bx^3+\ldots$ (i.e., the output contains distortion of the form $ax^2+bx^3+\ldots$). Accordingly, it is necessary to provide an error correction system that can introduce an error correction to the output of ADC 304 that is equal to $-ax^2+-bx^3+\ldots$.

As such, system 300 includes error correction system 302. In the depicted embodiment, error correction system 302 is configured to provide error correction to correct the squared (i.e., $x^2$) and cubed (i.e., $x^3$) error signals contained in the output of ADC 304, however it should be understood that the error correction approach depicted in FIG. 5 may be utilized to provide correction for higher order errors such as errors of the form $cx^4$, $dx^5$, or higher.

Error correction system 302 includes multiplier 312 (which may be implemented as a squaring function executed against a single copy of the signal received from ADC 304). Multiplier 312 is configured to receive, as input, two copies of the output signal of ADC 304. Multiplier 312 is configured to multiply the two copies together to generate an output signal that is equivalent to $(x+ax^2+bx^3\ldots)^2=x^2+ax^3+bx^4+a^2x^4$ etc. ... Because the values of the coefficients are much smaller than 1 (i.e., in $x+ax^2+ax^3$ the 'x' term is dominating), after squaring, the $x^2$ term is dominating. Then if the optimizer finds the coefficient '−a', an output can be generated that includes a dominating $-ax^2$ component and much smaller other components, that can be used as an error correction value to correct the $ax^2$ error signal. In various embodiments, however, multiplier 312 may be configured to output a signal that is an Nth powered version of the digital signal that is output by ADC 304, wherein the Nth powered version of the digital signal x is equal to the digital signal multiplied by itself N times, where N is a whole number equal to or greater than 2.

Error correction system 302 includes multiplier 314 (which may be implemented as a cubing function executed against a single copy of the signal received from ADC 304). Multiplier 314 is configured to receive, as input, three copies of the output signal of ADC 304. Multiplier 314 is configured to multiply the three copies together to generate an output signal that is equivalent to the cubed error signal $bx^3$ in the output of ADC 304. In various embodiments, however, multiplier 314 may be configured to output a signal that is an Nth powered version of the digital signal that is output by ADC 304, wherein the Nth powered version of the digital signal x is equal to the digital signal multiplied by itself N times, where N is a whole number equal to or greater than 2.

Error correction system 302 is configured to process the two input signals (e.g., by applying an appropriately configured loss function) to determine the values of coefficients a and b in the input error signals. The error correction system 302 outputs the additive inverse (negation) of those values (i.e., −a and −b) at output terminals 316 and 318, respectively. The output at terminal 316 (i.e., −a) is multiplied by the squared input signal by multiplier 320 to generate an output signal that is dominated by the $-ax^2$ term, which is added the output of ADC 304 by summing node 322 to correct or remove the squared error term in the output of ADC 304.

Similarly, the output at terminal 318 is multiplied by the cubed input signal by multiplier 324 to generate an output signal that is dominated by the $-bx^3$ term, which is added to the output of ADC 304 by summing node 322 to correct or remove the cubed error term in the output of ADC 304.

By providing the squared and cubed output of ADC 304 to error correction system 302, the error correction coefficients can be calculated using a numeric optimizer or a neural network. Specifically, because error correction system 302 knows the form of the polynomial error generated by ADC 304 (i.e., a polynomial function), the process of determining the value of the error correction coefficients and, thereby removing the non-linearities, can be made simpler because relation between the squared and cubed inputs to error correction system 302 and the outputs of error correction system 302 (i.e., the error correction coefficient values) is relatively simple to determine.

In the example presented in FIG. 5, only $2^{nd}$ and $3^{rd}$ order components are provided to the input of error correction system 302, however the same principle may be utilized to provide error correction for higher order error signals. Within system 300, the various multiplication operations performed by blocks 312, 314, 320, and 324 may be performed by a mathematical processor or, in cases where the number of potential values in the output signal of ADC 304 is relatively low, multiplication may be achieved via a look-up operation that does not perform the multiplication operation and instead accesses a data table that maps the input values to the multiplication result.

Figure 6:
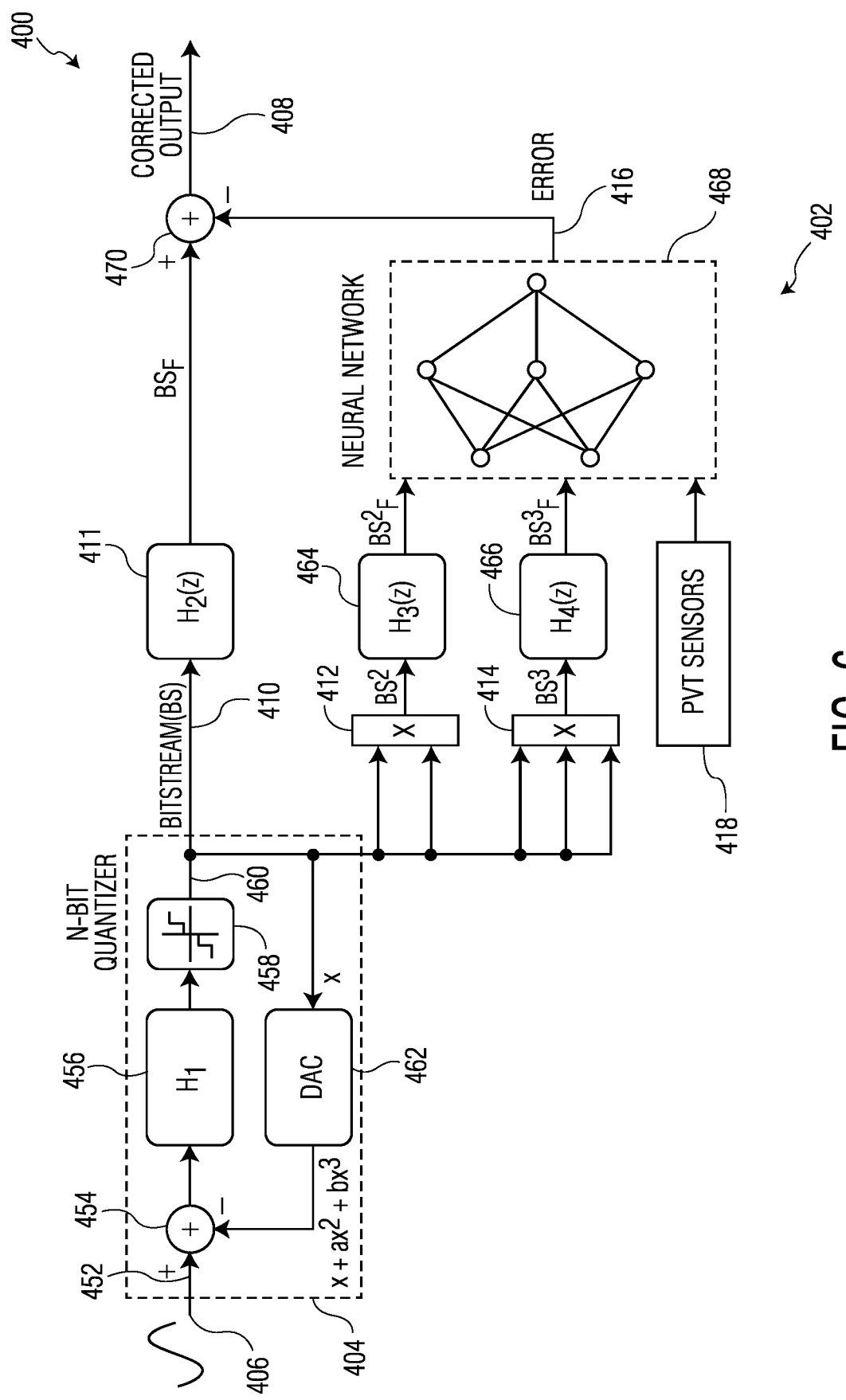
FIG. 6 depicts an ADC system that includes an error correction system that includes a neural network configured to correct or minimize errors generated by the ADC in the form of polynomial errors.

FIG. 6 depicts an ADC system 400 that includes an error correction system 402 configured to correct or minimize errors generated by sigma-delta ADC 404 in the form of polynomial errors. Specifically, sigma-delta ADC 404 includes an input terminal 452 configured to receive an analog input signal. The input signal is passed through summing node 454 to integrator 456 with a transfer function H1. The output of integrator 456 is supplied to quantizer 458, which is configured to convert the summed analog input signal to a digital value which is output as a digital bitstream at output terminal 460. In an ideal sigma-delta ADC 404 the output digital bitstream contains values that are equal to corresponding magnitudes of the analog input signal.

The digital bitstream output at output terminal 460 of sigma-delta ADC 404 is also passed back through digital to analog converter 462, which is configured to convert the digital bitstream into a corresponding analog signal. Ideally, the analog signal generated by digital to analog converter 462 is an exact match to the input signal originally received at input terminal 406.

The analog output of digital-to-analog converter 462 is supplied to a negative input to summing node 454, so that the analog signal output by digital-to analog converter 462 is subtracted from the analog input signal. The result of that subtraction is supplied to analog integrator 456. In this manner, sigma-delta ADC 404 is configured to generate a digital output bitstream having an average power level that matches the power level of the modulator's analog input signal. In real-world application of sigma-delta ADC 404, however non-linearities in the components of the modulator result in distortion being introduced into the output of sigma-delta ADC 404.

In one example, digital-to-analog converter 462 exhibits some non-linearities such that the output of digital to analog converter 462 includes some distortions. Specifically, as illustrated in FIG. 6 the output signal of digital to analog converter 462 includes polynomial non-linear components of the form $ax^2+bx^3+\ldots$. These additional distortion components can fold high-frequency spectral components back towards the baseband due to intermodulation, reducing the noise shaping benefits of the sigma-delta modulator implementation and increasing noise levels at frequencies around the frequency of the signal output by the modulator.

System 400 includes input terminal 406 configured to receive an analog input signal. System 400 is configured to convert that analog input signal into an output digital bitstream at output terminal 408. The magnitudes of the values in the output digital data stream are equivalent to the corresponding magnitude of the analog input signal.

Within system 400, sigma-delta ADC 404 is configured to periodically (e.g., at a sampling rate having frequency $f_s$) or continuously measure or sample a magnitude of the analog input signal and convert that analog value into a corresponding digital value that is output at as a bitstream (BS) (also referred to as the signal x) at output terminal 410 of sigma-delta ADC 404. The output bitstream BS is filtered through digital filter 411 and output as a filtered output bitstream signal $BS_F$. Filter 411 is typically configured as a low pass filter, but could also be a high- or band-pass filter. In some embodiments, filter 411 may be configured to include a delay element configured to compensate for signal delays occurring within error correction system 402 (or a separate delay element may be positioned between filter 411 and summing node 470).

To correct errors generated by sigma-delta ADC 404 (e.g., as a result of the non-linear error introduced by converter 462 of sigma-delta ADC 404), system 400 includes error correction system 402. In the depicted embodiment, error correction system 402 is configured to provide error correction to correct the squared (i.e., $x^2$) and cubed (i.e., $x^3$) error signals generated by components of the sigma-delta ADC 404, however it should be understood that the error correction approach depicted in FIG. 6 may be utilized to correction high order errors such as errors of the form of fourth order errors ($cx^4$), fifth order errors ($dx^5$), or higher.

To approximate those squared and cubed error signals, error correction system 402 includes multiplier 412. Multiplier 412 is configured to receive, as input, two copies of the output signal bitstream BS of sigma-delta ADC 404. Multiplier 412 is configured to multiply the two copies together to generate an output signal $BS^2$ that is equivalent to the squared error signal $ax^2$ that may be generated by components of sigma-delta ADC 404. The output signal of multiplier 412 is then passed through a filter 464 configured to filter-out unwanted frequencies in the output of multiplier 412. In typical applications, filter 464 is configured as a low-pass filter, though in other embodiments filter 464 may be implemented as a band-pass filter. In various embodiments, filter 464 has a cutoff frequency to block signals having frequencies greater than the frequency of the decimation filter contained within sigma-delta ADC 404. As such, filter 464 may be configured to filter or attenuate (i.e., reduce a magnitude of) signals having frequencies outside of the targeted bandwidth of sigma-delta ADC 404. In various embodiments, however, multiplier 412 may be configured to output a signal that is an Nth powered version of the digital signal that is output by sigma-delta ADC 404, wherein the Nth powered version of the digital signal x is equal to the digital signal multiplied by itself N times, where N is a whole number equal to or greater than 2.

Error correction system 402 includes multiplier 414. Multiplier 414 is configured to receive, as input, three copies of the output signal bitstream BS of sigma-delta ADC 404. Multiplier 414 is configured to multiply the three copies together to generate an output signal $BS^3$ that is equivalent to the cubed error signal $ax^3$ that may be generated by the components of sigma-delta ADC 404. The output signal of multiplier 414 is then passed through a filter 466 configured to filter-out unwanted frequencies in the output of multiplier 412. In typical applications, filter 466 is configured as a low-pass filter, though in other embodiments filter 466 may be implemented as a band-pass filter. In various embodiments, filter 466 has a cutoff frequency to block signals having frequencies greater than the frequency of the decimation filter contained within sigma-delta ADC 404. As such, filter 466 may be configured to filter or attenuate frequencies outside of the targeted bandwidth of sigma-delta ADC 404. Within system 400, the various multiplication operations performed by multipliers 412 and 414 may be performed by a mathematical processor or, because the potential values in the output signal of sigma-delta ADC 404 are relatively low, multiplication may be achieved via a look-up operation that does not perform the multiplication operation directly and instead accesses a data table that maps the input values to the multiplication result. In various embodiments, however, multiplier 414 may be configured to output a signal that is an Nth powered version of the digital signal that is output by sigma-delta ADC 404, wherein the Nth powered version of the digital signal x is equal to the digital signal multiplied by itself N times (i.e., the signal raised to the power of N), where N is a whole number equal to or greater than 2.

The filtered outputs of filter 464 and filter 466 are supplied as inputs to neural network 468 as filtered signals $BS^2_F$ and $BS^3_F$, respectively. Neural network 468 is configured to determine a corresponding correction value to minimize the network's loss function such that non-linear components contained within the output of sigma-delta ADC 404 can be cancelled by the correction signal. In a specific embodiment (e.g., in which neural network 468 is very simple and does not compensate for PVT non-linearities) neural network 468 may be configured to process the two input signals (e.g., by applying an appropriately configured loss function) to directly determine the values of coefficients a and b in the input error signals and output an appropriate error correction signal F at output terminal 416.

The output of neural network 468 at terminal 416 (i.e., the error correction signal F) is subtracted from the filtered output bitstream $BS_F$ of sigma-delta ADC 404 at summing node 470 correct or remove the polynomial error term in the output of sigma-delta ADC 404.

The corrected signal is output at output terminal 408 of system 400.

The correction provided by neural network 468 depicted in FIG. 6 is configured to correct 2nd and 3rd order distortion components present in the output bitstream BS of sigma-delta ADC 404. Specifically, the output of sigma-delta ADC 404, which is influenced by the distortion created by digital-to-analog converter 462, which is in the form of polynomial distortion, is squared and cubed and passed through filters 464 and 466 to filter out frequency bands in the squared and cubed signals that are not of interest. Neural network 468 then uses the filtered and squared and the filtered and cubed bitstream inputs (i.e., $BS_2^F$ and $BS_3^F$) to predict the polynomial error (or, at least, the squared and cubed error signals) within the filtered bitstream ($BS_F$) and applies corresponding error compensation at the output of system 400 to provide a corrected output signal.

In various embodiments, neural network 468 may be trained to provide further error correction for other sources of error that may be present within sigma-delta ADC 404 or other components of system 400.

For example, the performance and accuracy of sigma-delta ADC 404 may be affected by process-voltage-temperature (PVT) factors that affect the output of sigma-delta ADC 404. In these types of variations, process variations account for deviations in the semiconductor fabrication process of components of sigma-delta ADC 404. Process variations may be due to variations in the manufacturing conditions such as temperature, pressure, and dopant concentrations. Various voltages (e.g., supply voltage, reference voltage, bias condition on a device) utilized within the various ICs making up system 400 can vary from the established designed value during day-to-day operation and also over its lifetime, which can affect the operation of circuit components of sigma-delta ADC 404. Similarly, when the device is operating, temperature fluctuations can affect operational parameters of various circuit components.

Accordingly, one or more sensor 418 that measure one or more PVT variables may optionally be incorporated into system 400 to provide PVT parameters to neural network 468 so that the neural network 468 can adjust the value of error correction signal F to correct for PVT variations. As a result, neural network 468 can be trained with a cost function that will take into account the PVT effects on the errors caused by such processing inputs to be utilized for adjusting the weights and/or biases within the nodes of the neural network 468.

In accordance with various embodiments of the present disclosure any type of process related information could be added as a PVT Input to neural network 468, such as various technology parameters (e.g., electron mobility, transistor parameters (e.g., Vt, fT, Beta, doping), resistor parameters (e.g., nominal resistor value, voltage dependency), or capacitor parameters (e.g., nominal capacitor value, voltage dependency). As long as there is a manner in which to measure a process related parameter, then the output of this measurement can be provided as a PVT Input to the neural network 468.

During operation of system 400, neural network 468 is configured to, based upon the squared and cubed input bitstreams ($BS^2_F$ and $BS^3_F$), determine an error correction signal F, which is configured to compensate for non-linearities in the output of sigma-delta ADC 404. Given such a relatively straight forward mathematical operation, it may not be the case that error correction system 402 must be implemented using neural network 468 and that instead neural network 468 may be replaced by a more conventional mathematical function. However, when multiple distortion sources are simultaneously present, such as when system 400 includes one or more PVT sensor 418 configured to provide PVT parameters to error correction system 402 enabling to correct PVT-induced errors, or other types of complex errors such as inter-symbol interference, incomplete settling in circuits, mismatch in circuit components, etc., the form of those errors can be relatively complex requiring more complex solutions, such as neural network.

Neural network 468 of system 400 may be trained through the use of known training data in accordance known techniques for training a neural network. For example, in accordance with certain embodiments of the present disclosure, a known analog input signal can be supplied at input terminal 406 of system 400. The known analog input signal is such that, when processed by an ideal ADC, the ideal ADC would generate a known output bitstream. In that configuration, neural network 468 can then be trained by an error signal, which is equivalent to the difference between the output digital bitstream generated by sigma-delta ADC 404 and the known output bitstream. The error signal produced is passed through a cost function that can be used to train the neural network 468 (e.g., using a Levenberg-Marquardt algorithm, backpropagation (gradient descent) algorithm, or similar algorithms). In that approach, backpropagation computes the gradient in weight space of a feedforward neural network, with respect to a loss function. Using backpropagation, computational parameters (e.g., weights and/or biases) of the neural network 468 are adapted (e.g., following a steepest descent method, also known as gradient descent).

However, it should be apparent to a person of ordinary skill in the art that any suitable cost function and training algorithm may be utilized for training neural network 468. The training phase may be continuously, or repeatedly, performed until the output bitstream of sigma-delta ADC 404 has minimum errors (or at least a desired set of fewer errors) as compared to the known output bitstream after completion of the training phase.

Figure 7:
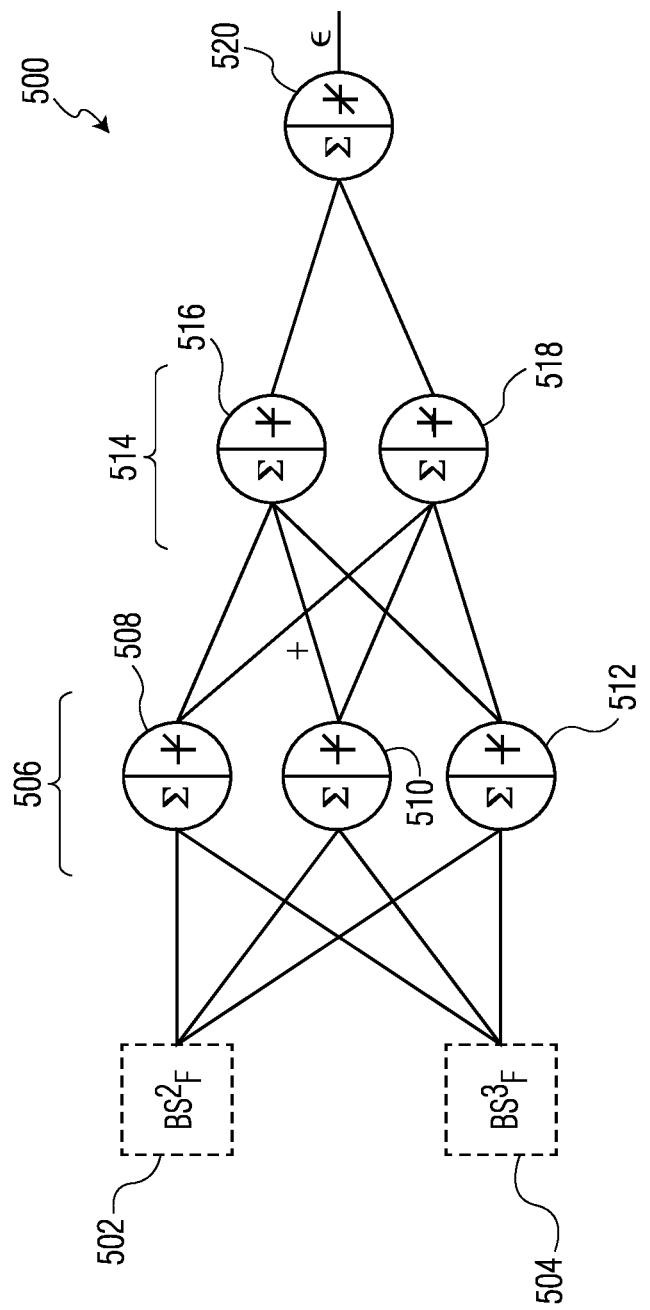
FIG. 7 depicts a neural network that may be used to implement the functionality of the neural network of FIG. 6.

FIG. 7 depicts a neural network 500 that may be used to implement the functionality of neural network 468 of FIG. 6. Neural network 500 includes input 502 configured to receive the squared and filtered version of the bitstream $BS^2_F$ generated by an ADC (e.g., sigma-delta ADC 404 of FIG. 6 or ADC 304 of FIG. 5). Neural network 500 includes input 504 configured to the cubed and filtered version of the bitstream $BS^3_F$ generated by the ADC (e.g., sigma-delta ADC 404 of FIG. 6 or ADC 304 of FIG. 5).

The inputs 502 and 504 are connected to a first layer 506 of neurons 508, 510, and 512. Each neuron 508, 510, and 512 is configured to implement activation functions such that the output of the neuron is a default value when the input signal to the neuron falls below some threshold value. However, when the input to the neuron exceeds that threshold or activation level, the output of the neuron is a linear function of the input value. In some embodiments, the linear function is configured to cause the neuron to output a copy of the input signal if that input signal exceeds the activation threshold. As such, neurons 508, 510, and 512 may be implemented as rectified linear units (ReLUs), though it will be apparent to a person of ordinary skill in the art that other neuron configurations may be utilized.

Each neuron 508, 510, and 512 receives and sums a weighted version of the squared and cubed signals received at inputs 502 and 504. Based on those summed values and the neuron's individual activation functions, the neurons 508, 510, and 512 generate output values. In some cases, neurons 508, 510, and 512 may be configured to implement biases that may modify the outputs of each neuron 508, 510, and 512.

The second layer 514 of neural network 500 includes neurons 516 and 518. Each neuron 516 and 518 is configured to implement activation functions such that the output of the neuron is a default value when the input signal to the neuron falls below some threshold value. However, when the input to the neuron exceeds that threshold or activation level, the output of the neuron is a linear function of the input value. In some embodiments, the linear function is configured to cause the neuron to output a copy of the input signal if that input signal exceeds the activation threshold. In some cases, neurons 516 and 518 may be configured to implement biases that may modify the outputs of each neuron 516 and 518.

As such, neurons 516 and 518 may be implemented as rectified linear units (ReLUs), though it will be apparent to a person of ordinary skill in the art that other neuron configurations may be utilized.

Each neuron 516 and 518 receives and sums the weighted outputs of each neuron 508, 510, and 512 in the preceding layer 506. Based on those summed values and the neuron's individual activation functions, the neurons 516 and 518 generate output values.

The output node 520 of neural network 500 is a neuron configured to implement a linear activation function such that the output of output node 520 is the sum of the two input signals. Accordingly, output node 520 receives and sums the weighted output of each neuron 516 and 518 in layer 514 and, based on the summed value generates an output that is equivalent to the error correction signal F. That error correction signal may be utilized, as described herein, to correct error in the ADC output $BS_F$ that may be generated by non-linearities in the ADC.

Although neural network 500 is described as being implemented by ReLU neurons, it should be readily apparent to a person of ordinary skill in the art that different neural network configurations may be utilized. As such, it is expressly contemplated that neural network 500 may be implemented using other neural network or machine learning structures, such as perceptron networks, feed forward neural networks, convolutional neural networks, recurrent neural networks, and the like. One or more neuron of network 500 may be configured any suitable activations, such as hyperbolic tangent activation functions depending upon the system implementation.

In the configuration depicted in FIG. 5, the neural network 500 is configured to process the squared and cubed input bitstreams to determine an appropriate error correction value F. Given this goal for the neural network, in some embodiments, the functionality of neural network 500 may be provided by other circuit structures or computational models in which a specific neural network implementation may not be required—i.e., a simpler solution would suffice. However, when multiple distortion sources are simultaneously present in the ADC output, such as inter-symbol interference, incomplete settling in circuits, mismatch in circuit components, etc., these relations become much more complex, and such simpler solutions would not suffice. Further, given circuit implementation where ADC errors are at least partially determined by PVT parameters, very complex dependencies between non-linear distortion sources may be present in the ADC output, which can be difficult to determine and correct via pure mathematical (i.e., non machine learning) approaches.

Figure 8:
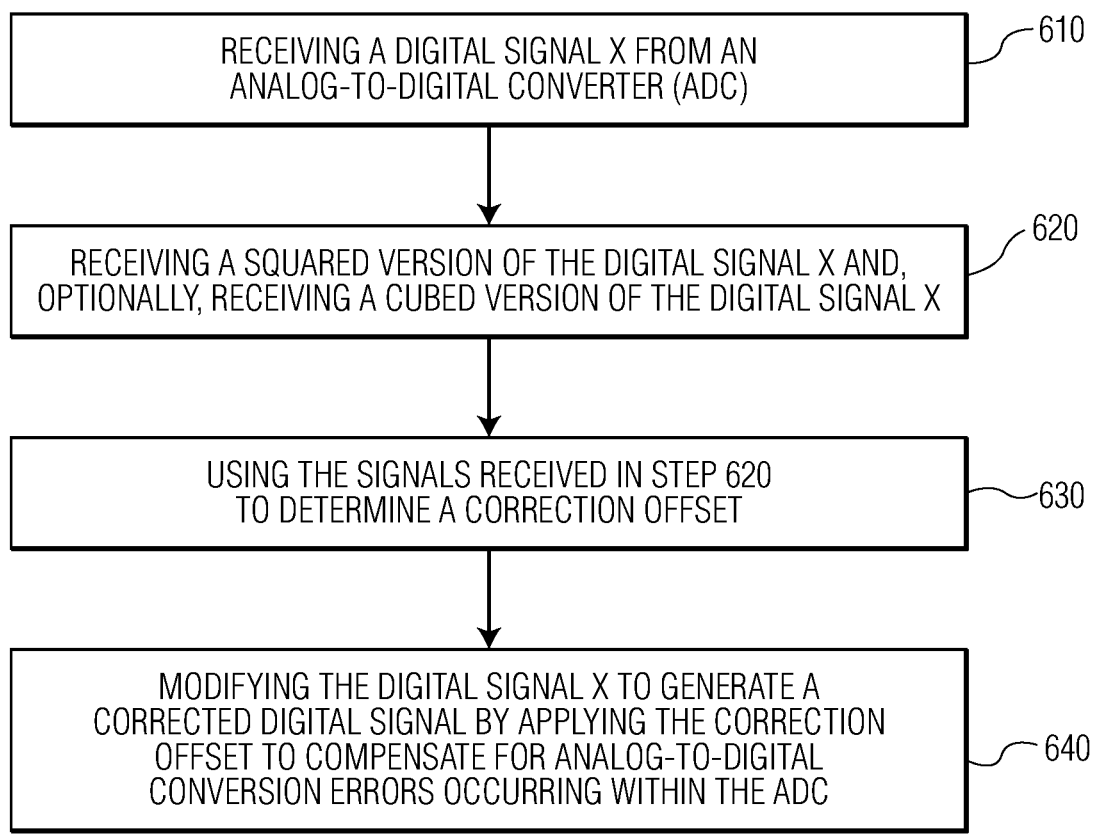
FIG. 8 depicts a method that may be implemented by an error correction system to provide error correction to an output signal of an ADC.

FIG. 8 depicts a method that may be implemented by an error correction system (e.g., error correction system 302 of FIG. 5 or error correction system 402 of FIG. 6 to provide error correction for an output signal of an ADC (e.g., ADC 304 of FIG. 5 or sigma-delta ADC 404 of FIG. 6). In step 610, the output signal x of the ADC is received. As described above, the signal x generally takes the form of an output digital bit or code stream generated by the ADC. At step 620, a squared version of the output signal x is determined. Optionally, step 620 may further include receiving a cubed version of the output signal x. In still further embodiments, step 620 may include receiving higher-order versions (e.g., fourthed, fifthed, or higher) of the output signal x of the ADC).

The signals received at step 620 are supplied to a neural network (e.g., neural network 468 of FIG. 6) or another processing system to enable, in step 630, the determination of a correction value that is configured to cancel the error signals as they appeared in the signals received in step 620 using the techniques as described herein.

In step 640, the correction value is applied to the digital signal x to generate a corrected digital signal to compensate for analog-to-digital conversion errors occurring within the ADC. That corrected signals can then be outputted at an appropriate device output terminal (e.g., output terminal 308 of FIG. 5, or output terminal 408 of FIG. 6).

Figure 10:
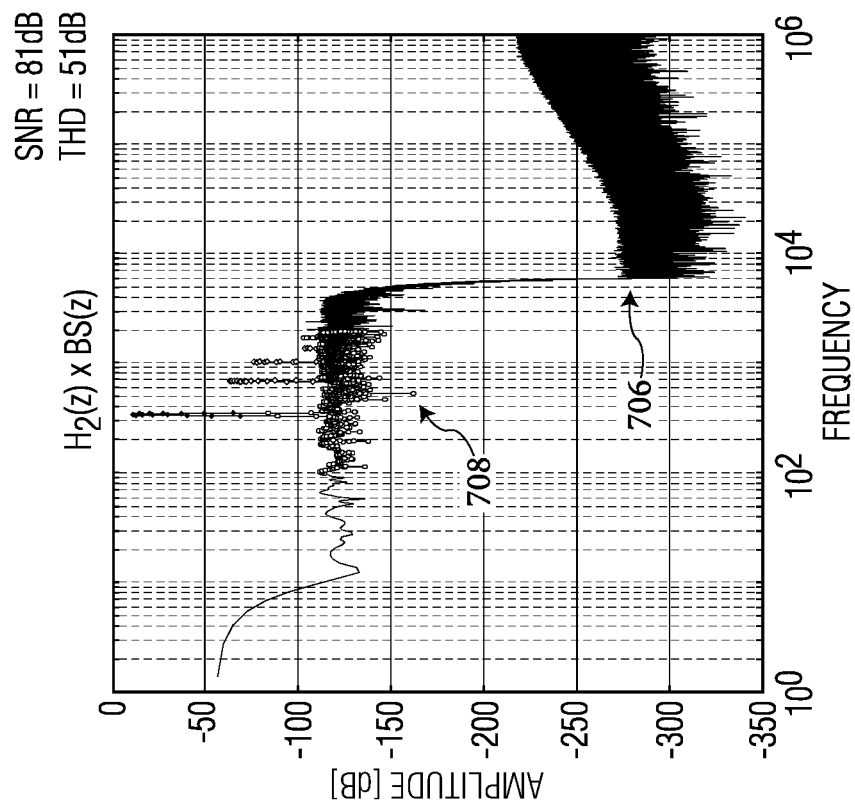
FIG. 10 depicts the low-pass filtered frequency domain output signal of a sigma-delta ADC where second and third order circuit non-linearities result in a distorted and noisy output signal.
Figure 9:
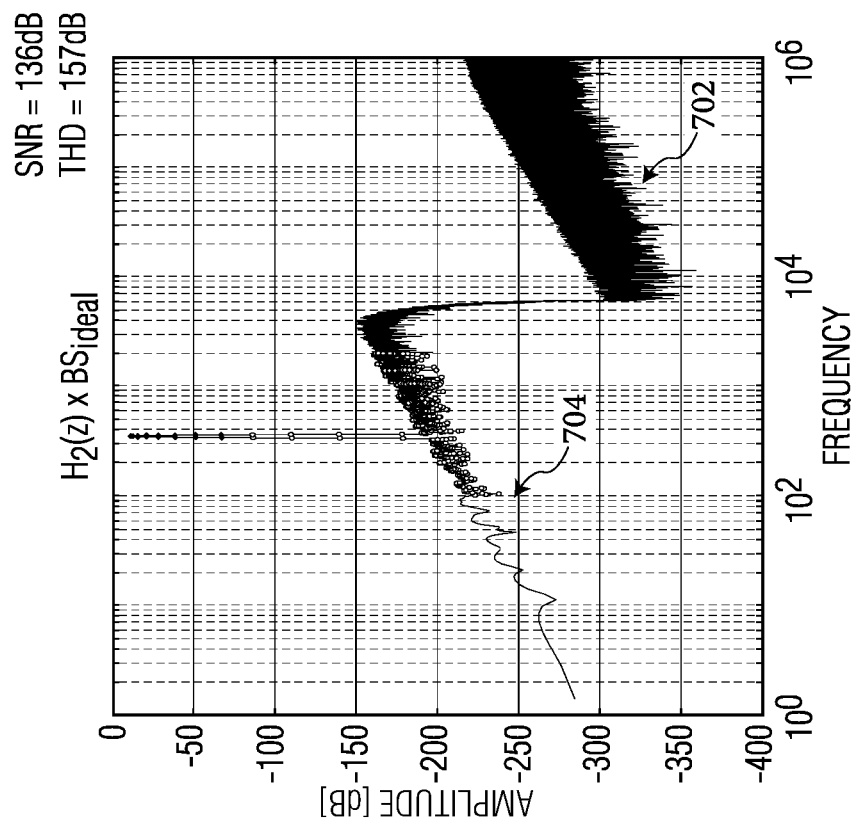
FIG. 9 depicts a low-pass filtered frequency domain output signal of an ideal sigma-delta ADC without error correction.

To illustrate the noise-reduction benefits of the present disclosure, FIG. 9 depicts a frequency domain output signal of an ideal sigma-delta ADC. As illustrated in FIG. 9, the output signal includes a region of noise 702 having a high frequency and that, as described herein, can be filtered from the output signal of the ideal ADC. Furthermore, the noise floor on the portion of the output signal 704 that contains the actual output of the ideal ADC is relatively low and includes no IM or noise products. In contrast, FIG. 10 depicts the frequency domain output signal of a non-ideal sigma-delta ADC in which no error correction has been performed. As depicted in FIG. 10, there is still a significant amount of noise in the high frequency range 706 of the non-ideal sigma-delta ADC, however that noise has folded back into the spectrum of interest, resulting in a number of large IM products and other noise artifacts 708.

Figure 11:
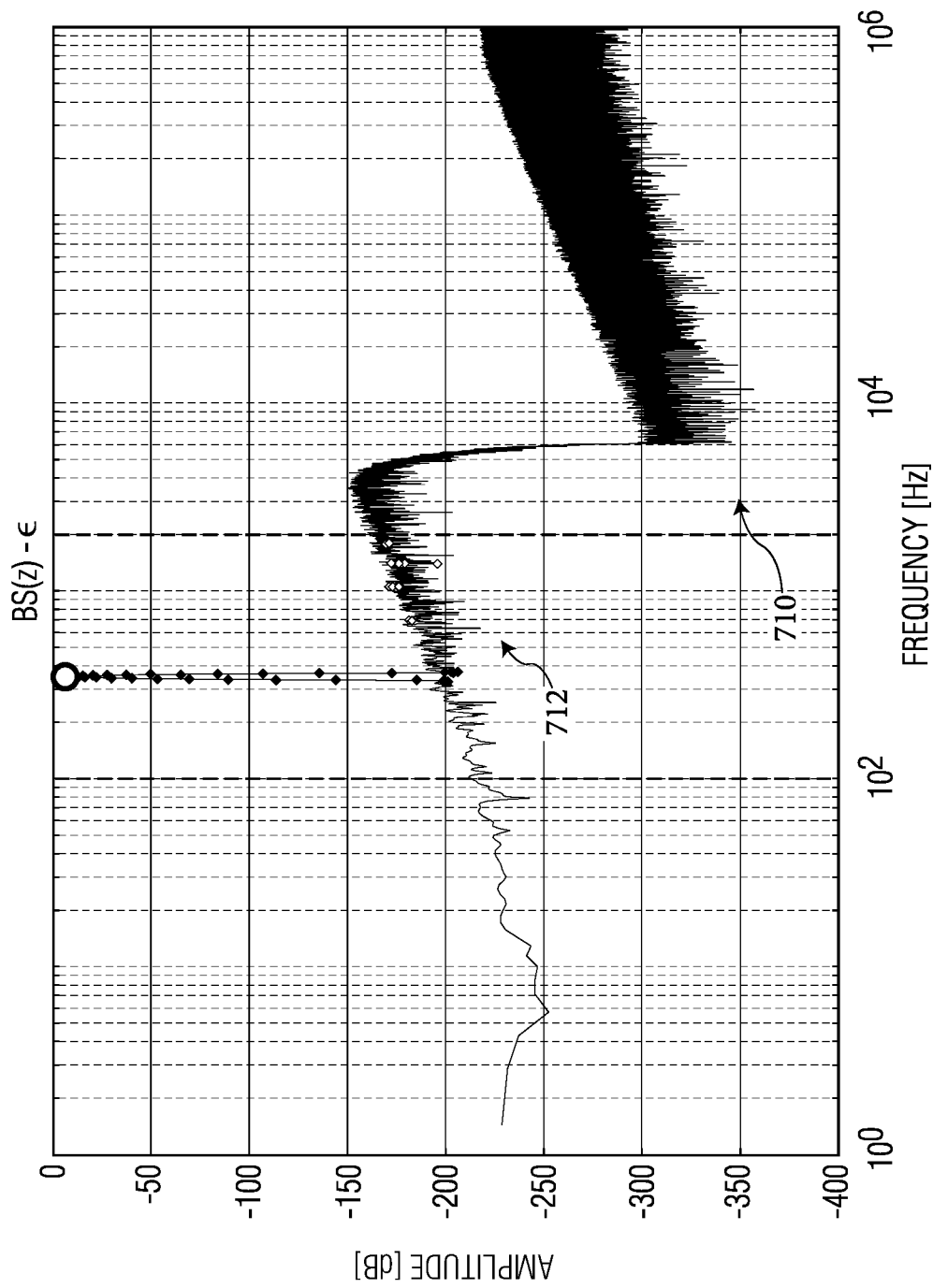
FIG. 11 depicts the low-pass filtered frequency domain output signal of a sigma-delta ADC that contains second and third order circuit non-linearities on which error correction in accordance with the present disclosure has been performed.

To contrast the uncorrected output signal depicted in FIG. 10, FIG. 11 depicts the frequency domain output signal of a sigma-delta ADC in which error correction in accordance with the present disclosure has been performed. As illustrated in FIG. 11, the output signal includes high frequency noise 710. However, with correction, the IM products and noise artifacts that were observed in the non-corrected output signal of FIG. 10 have been removed and are not present within the portion 712 of the output signals that contains the data output of the ADC.

As has been described herein, various embodiments of the present disclosure implement an error correction system configured to compensate for ADC errors in ADC devices, such as Nyquist and sigma-delta ADC devices. Such an error correction system may include a neural network implemented within hardware and/or software, such as within one or more data processing systems. Nevertheless, the functionalities described herein are not to be limited for implementation into any particular hardware/software platform.

As will be appreciated by one skilled in the art, aspects of the present disclosure may be embodied as a system, process, method, and/or program product. Accordingly, various aspects of the present disclosure (e.g., the machine learning system) may take the form of an entirely hardware embodiment, an entirely software embodiment (including firmware, resident software, micro-code, etc.), or embodiments combining software and hardware aspects, which may generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium(s) may be utilized. The computer readable medium may be a computer readable signal medium or a computer readable storage medium.)

A computer readable storage medium may be, for example, but not limited to, an electronic, magnetic, optical, electromagnetic, infrared, biologic, atomic, or semiconductor system, apparatus, controller, or device, or any suitable combination of the foregoing, wherein the computer readable storage medium is not a transitory signal per se. More specific examples (a non-exhaustive list) of the computer readable storage medium may include the following: an electrical connection having one or more wires, a portable computer diskette, a hard disk, a random access memory ("RAM"), a read-only memory ("ROM"), an erasable programmable read-only memory ("EPROM" or flash memory), an optical fiber, a portable compact disc read-only memory ("CD-ROM"), an optical storage device, a magnetic storage device, or any suitable combination of the foregoing. In the context of this document, a computer readable storage medium may be any tangible medium that can contain or store a program for use by or in connection with an instruction execution system, apparatus, controller, or device. Program code embodied on a computer readable signal medium may be transmitted using any appropriate medium, including but not limited to wireless, wire line, optical fiber cable, RF, etc., or any suitable combination of the foregoing.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, controller, or device.

The block diagrams in the figures illustrate architecture, functionality, and operation of possible implementations of circuitry, systems, methods, processes, and program products according to various embodiments of the present disclosure. In this regard, certain blocks in the block diagrams (e.g., error correction system 302 neural network 468 and/or neural network 500) may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module, and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

These program instructions may be provided to one or more processors and/or controller(s) of a general-purpose computer, special purpose computer, or other programmable data processing apparatus (e.g., controller) to produce a machine, such that the instructions, which execute via the processor(s) of the computer or other programmable data processing apparatus, create circuitry or means for implementing the functions/acts specified in the block diagram block or blocks.

It will also be noted that each block of the block diagrams, and combinations of blocks in the block diagrams, can be implemented by special purpose hardware-based systems (e.g., which may include one or more graphics processing units) that perform the specified functions or acts, or combinations of special purpose hardware and computer instructions. For example, a module (e.g., error correction system 302 neural network 468 and/or neural network 500) may be implemented as a hardware circuit including custom VLSI circuits or gate arrays, off-the-shelf semiconductors such as logic chips, transistors, controllers, or other discrete components. A module (e.g., error correction system 302 neural network 468 and/or neural network 500) may also be implemented in programmable hardware devices such as field programmable gate arrays, programmable array logic, programmable logic devices, application specific ICs, microcontrollers, systems on a chip, general purpose processors, microprocessors, or the like.

Computer program code, i.e., instructions, for carrying out operations for aspects of the present disclosure may be written in any combination of one or more programming languages, including an object-oriented programming language such as Java, Smalltalk, Python, C++, or the like, conventional procedural programming languages, such as the "C" programming language or similar programming languages, or any of the machine learning software disclosed herein.

These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The program instructions may also be loaded onto a computer, other programmable data processing apparatus, controller, or other devices to cause a series of operational steps to be performed on the computer, other programmable apparatus or other devices to produce a computer implemented process such that the instructions which execute on the computer, other programmable apparatus, or other devices provide processes for implementing the functions/acts specified in the block diagram block or blocks.

In some aspects, the techniques described herein relate to a system, including: an analog-to-digital converter (ADC) including: an input terminal configured to receive an analog input signal, and an output terminal configured to output a digital signal x, wherein the digital signal x includes a digital approximation of the analog input signal; and an error correction system connected to the ADC, the error correction system including a first input terminal configured to receive an Nth powered version of the digital signal x, wherein N is a whole number equal to or greater than two, wherein the error correction system is configured to: use the Nth powered version of the digital signal x to determine a correction value; and modify the digital signal x to generate a corrected digital signal by applying the correction value to compensate for analog-to-digital conversion errors occurring within the ADC.

In some aspects, the techniques described herein relate to a system, including: an analog-to-digital converter (ADC) including: an input terminal configured to receive an analog input signal, a summing node connected to the input terminal, an output terminal configured to output a digital signal x, wherein the digital signal x includes a digital approximation of the analog input signal, and a digital-to-analog converter electrically connected between the output terminal and the summing node, wherein the digital-to-analog converter is configured to: receive the digital signal from the output terminal; and convert the digital signal into a second analog signal, wherein the digital signal x includes a polynomial error signal having a form of $ax2+bx3+\ldots$; and an error correction system connected to the ADC, the error correction system including: a first input terminal configured to receive a squared version of the digital signal x, and a neural network configured to: use the squared version of the digital signal x to determine a correction value; and modify the digital signal x to generate a corrected digital signal by applying the correction value to the digital signal x to compensate for the polynomial error signal generated by the digital-to-analog converter.

In some aspects, the techniques described herein relate to a method, including: receiving a digital signal x from an analog-to-digital converter (ADC) that is configured to receive an analog input signal and output the digital signal x, wherein the digital signal x includes a digital approximation of the analog input signal; receiving a Nth powered version of the digital signal x, wherein N is a whole number equal to or greater than two; using the Nth powered version of the digital signal x to determine a correction value; and modifying the digital signal x to generate a corrected digital signal by applying the correction value to compensate for analog-to-digital conversion errors occurring within the ADC.

The preceding detailed description is merely illustrative in nature and is not intended to limit the embodiments of the subject matter or the application and uses of such embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system, comprising:
   an analog-to-digital converter (ADC) including:
      an input terminal configured to receive an analog input signal, and
      an output terminal configured to output a digital signal x, wherein the digital signal x includes a digital approximation of the analog input signal; and
   an error correction system connected to the ADC, the error correction system including a first input terminal configured to receive an Nth powered version of the digital signal x, wherein N is a whole number equal to or greater than two, wherein the error correction system is configured to:
      use the Nth powered version of the digital signal x to determine a correction value; and
      modify the digital signal x to generate a corrected digital signal by applying the correction value to compensate for analog-to-digital conversion errors occurring within the ADC;
   wherein the error correction system includes a neural network configured to determine the correction value.

2. The system of claim 1, wherein the ADC is a sigma-delta ADC.

3. The system of claim 1, further comprising a sensor configured to provide a parameter to the error correction system, wherein the output of the ADC varies as a function of a value of the parameter and the parameter includes at least one of a semiconductor manufacturing related process variation, a voltage, and a temperature.

4. The system of claim 3, wherein the neural network has been configured by a training phase to compensate for variations in the output of the ADC using the parameter.

5. A system, comprising:
   an analog-to-digital converter (ADC) including:
      an input terminal configured to receive an analog input signal, and
      an output terminal configured to output a digital signal x, wherein the digital signal x includes a digital approximation of the analog input signal; and
   an error correction system connected to the ADC, the error correction system including a first input terminal configured to receive an Nth powered version of the digital signal x, wherein N is a whole number equal to or greater than two, wherein the error correction system is configured to:
      use the Nth powered version of the digital signal x to determine a correction value; and
      modify the digital signal x to generate a corrected digital signal by applying the correction value to compensate for analog-to-digital conversion errors occurring within the ADC;
   wherein the ADC is a sigma-delta ADC;
   wherein:
      the sigma-delta ADC is a multi-bit sigma delta ADC;
      the error correction system includes a second terminal configured to receive an Mth powered version of the digital signal x, wherein M is a whole number equal to or greater than two; and
      the error correction system is configured to determine the correction value using the Mth powered version of the digital signal x.

6. The system of claim 5, wherein N is equal to two and M is equal to three.

7. The system of claim 5, wherein the error correction system includes a neural network configured to determine the correction value.

8. A system, comprising:
   an analog-to-digital converter (ADC) including:
      an input terminal configured to receive an analog input signal, and
      an output terminal configured to output a digital signal x, wherein the digital signal x includes a digital approximation of the analog input signal; and
   an error correction system connected to the ADC, the error correction system including a first input terminal configured to receive an Nth powered version of the digital signal x, wherein N is a whole number equal to or greater than two, wherein the error correction system is configured to:
use the Nth powered version of the digital signal x to determine a correction value; and
modify the digital signal x to generate a corrected digital signal by applying the correction value to compensate for analog-to-digital conversion errors occurring within the ADC;
wherein the ADC has a first bandwidth and further comprising a filter connected between the first input terminal of the error correction system and the error correction system, wherein the filter is configured to attenuate signals having a frequency outside of a second bandwidth.

9. The system of claim 8, wherein the first bandwidth is equal to the second bandwidth.

10. A system, comprising:
an analog-to-digital converter (ADC) including:
an input terminal configured to receive an analog input signal,
a summing node connected to the input terminal,
an output terminal configured to output a digital signal x, wherein the digital signal x includes a digital approximation of the analog input signal, and
a digital-to-analog converter electrically connected between the output terminal and the summing node, wherein the digital-to-analog converter is configured to:
receive the digital signal from the output terminal; and
convert the digital signal into a second analog signal, wherein the digital signal x includes a polynomial error signal having a form of $ax^2+bx^3+ \ldots$ ; and
an error correction system connected to the ADC, the error correction system including:
a first input terminal configured to receive a squared version of the digital signal x, and
a neural network configured to:
use the squared version of the digital signal x to determine a correction value; and
modify the digital signal x to generate a corrected digital signal by applying the correction value to the digital signal x to compensate for the polynomial error signal generated by the digital-to-analog converter.

11. The system of claim 10, further comprising a sensor configured to provide a parameter to the neural network, wherein the output of the ADC varies as a function of a value of the parameter and the parameter includes at least one of a process parameter, a voltage parameter, and a temperature parameter.

12. The system of claim 11, wherein the neural network has been configured by a training phase to compensate for variations in an output of the ADC using the parameter.

13. The system of claim 10, wherein the ADC has a first bandwidth and further comprising a filter connected between the first input terminal of the error correction system and the neural network, wherein the filter is configured to attenuate signals having a frequency outside of a second bandwidth.

14. The system of claim 13, wherein the first bandwidth is equal to the second bandwidth.

15. A method, comprising:
receiving a digital signal x from an analog-to-digital converter (ADC) that is configured to receive an analog input signal and output the digital signal x, wherein the digital signal x includes a digital approximation of the analog input signal;
receiving a Nth powered version of the digital signal x, wherein N is a whole number equal to or greater than two;
using the Nth powered version of the digital signal x to determine a correction value; and
modifying the digital signal x to generate a corrected digital signal by applying the correction value to compensate for analog-to-digital conversion errors occurring within the ADC;
wherein the ADC has a first bandwidth and further comprising attenuating signals having a frequency outside of the first bandwidth from the Nth powered version of the digital signal x.

16. The method of claim 15, wherein the ADC is a sigma-delta ADC.

17. A method, comprising:
receiving a digital signal x from an analog-to-digital converter (ADC) that is configured to receive an analog input signal and output the digital signal x, wherein the digital signal x includes a digital approximation of the analog input signal;
receiving a Nth powered version of the digital signal x, wherein N is a whole number equal to or greater than two;
using the Nth powered version of the digital signal x to determine a correction value; and
modifying the digital signal x to generate a corrected digital signal by applying the correction value to compensate for analog-to-digital conversion errors occurring within the ADC;
wherein the ADC is a sigma-delta ADC:
wherein the sigma-delta ADC is a multi-bit sigma delta ADC and further comprising:
receiving an Mth powered version of the digital signal x, wherein M is a whole number equal to or greater than two; and
determining the correction value using the Mth powered version of the digital signal x.

18. The method of claim 17, wherein N is equal to the two and M is equal to three.

19. The method of claim 17, wherein the ADC has a first bandwidth and further comprising attenuating signals having a frequency outside of the first bandwidth from the Nth powered version of the digital signal x.

20. A method, comprising:
receiving a digital signal x from an analog-to-digital converter (ADC) that is configured to receive an analog input signal and output the digital signal x, wherein the digital signal x includes a digital approximation of the analog input signal;
receiving a Nth powered version of the digital signal x, wherein N is a whole number equal to or greater than two;
using the Nth powered version of the digital signal x to determine a correction value; and
modifying the digital signal x to generate a corrected digital signal by applying the correction value to compensate for analog-to-digital conversion errors occurring within the ADC;
receiving a parameter from a sensor, wherein the parameter includes at least one of a semiconductor manufacturing related process variation, a voltage, and a temperature; and determining the correction value using the parameter, wherein the output of the ADC varies as a function of a value of the parameter.

\* \* \* \* \*